United States Patent [19]
Utesch et al.

[11] Patent Number: 5,109,265
[45] Date of Patent: Apr. 28, 1992

[54] SEMICONDUCTOR MEMORY WITH CONNECTION PADS DISPOSED IN THE INTERIOR

[75] Inventors: Matthias Utesch, Hof/s; Martin Peisl, Munich, both of Fed. Rep. of Germany

[73] Assignee: Siemens Aktiengesellschaft, Munich, Fed. Rep. of Germany

[21] Appl. No.: 617,632

[22] Filed: Nov. 26, 1990

[30] Foreign Application Priority Data

Nov. 24, 1989 [EP] European Pat. Off. ......... 89121736.6

[51] Int. Cl.⁵ .................... H01L 27/10; H01L 23/48; H01L 27/02
[52] U.S. Cl. .......................... 357/45; 357/68; 357/41; 365/51
[58] Field of Search ................ 357/45, 68; 365/51

[56] References Cited

U.S. PATENT DOCUMENTS

| 4,796,224 | 1/1989 | Kawai et al. | 365/51 |
| 4,864,381 | 9/1989 | Seefeldt et al. | 357/45 |

FOREIGN PATENT DOCUMENTS 0130798  1/1985  European Pat. Off. .

OTHER PUBLICATIONS

IEEE Journal of Solid-State Circuits, vol. SC-19, No. 5, Oct. 1984, pp. 627–633, IEEE, N.Y., U.S.; J. Yamada et al.: "A Submicron 1 Mbit dynamic RAM with a 4-Bit-at-a-Time built-In ECC Circuit".

IEEE International Solid-State Circuits Conference 1989, pp. 352–355.

Primary Examiner—Rolf Hille
Assistant Examiner—Robert P. Limanek
Attorney, Agent, or Firm—Herbert L. Lerner; Laurence A. Greenberg

[57] ABSTRACT

A semiconductor memory includes a rectangular chip surface having corners. Four combined cell field blocks are each disposed at a respective one of the corners of the chip surface. Rectangular cell field blocks are combined in each of the combined cell field blocks, with each two of the cell field blocks having edges facing each other. Cell fields are combined into each of the cell field blocks, with the cell fields having word and bit lines. Decoder blocks face each other on the edges of the cell field blocks. The chip surface has a surface area between the decoder blocks being free of cell fields. Peripheral circuit blocks are disposed inside the surface area being free of cell fields. Connection paths are disposed inside the surface area being free of cell fields for connecting the semiconductor memory to connections of a housing.

6 Claims, 1 Drawing Sheet

SEMICONDUCTOR MEMORY WITH CONNECTION PADS DISPOSED IN THE INTERIOR

The invention relates to a semiconductor memory on a rectangular chip surface, wherein
the semiconductor memory includes decoder blocks, peripheral circuit blocks, cell fields with word and bit lines, and a surface area being free of cell fields;
the cell fields being combined into rectangular cell field blocks;
the decoder blocks each being disposed on edges of two cell field blocks facing each other;
the peripheral circuit blocks being disposed inside the surface area being free of cell fields; and
connection paths for connecting the semiconductor memory to connections of a housing.

There has been continuous progress in the development of semiconductor memories in recent years. While the 256K bit chip was state of the art just a few years ago, today the first 4 and 16-megabyte chips are now being shipped. Each new generation of semiconductor memories represents a quadrupling of the memory capacity, but the chip surface area usually increases by only a maximum of one and a half times. That means that the structures on the semiconductor memory become so small that when planning the layout thereof, the conditions to be described below must be adhered to.

The memory cells of a dynamic semiconductor memory, for instance, are disposed in cell fields at the intersections of word and bit lines. Each memory cell includes a switching transistor and a capacitor. The gate terminal of each transistor is connected to a word line. Each capacitor of a memory cell is connected with one bit line, through the load path of the switching transistor. A column of the cell field is then selected through the word lines. In that way, the various capacitances of the cells of the column that are addressed are switched to the bit lines associated with that column. A first condition is therefore that the bit lines be as short as possible, in order to avoid parasitic effects dictated by additional line capacitances. That means that the ratio between the cell capacitance of the bit line capacitance, and the junction capacitance of the switching transistor, must be as high as possible. That is assured with short bit lines.

One option for lessening the influence of the bit line capacitance is to connect driver stages between individual cell fields. However, arbitrary numbers of such driver stages cannot be used, because the housing size limits the size of the chip surface. Another condition is that the memory chip must be mountable, and that the location of the pads or paths with respect to the connection of the memory chips to the housing connections must meet the condition of bondability.

The proceedings of the IEEE International Solid-State Circuits Conference 1989, pp. 246-249 and pp. 352-355, disclose a large-scale integrated 16-megabyte chip, in which the layout is provided in such a way that the paths are located on the chip periphery, but the cell fields are disposed rectangularly in four single cell switching blocks. The decoder blocks on edges of each of two single cell field blocks that face each other are disposed between the facing decoder blocks. The peripheral circuit blocks are disposed parallel to the shorter chip side, inside the free surface area between the facing decoder blocks and on the edges of the chip surface.

A prior art configuration is also shown in Fig. 1 of the drawings herein. However, a disadvantage of that configuration is that the lines for connecting peripheral circuits or the connection paths or pads to other circuit blocks become quite long. Moreover, with an increasing scale of integration, the length of the word lines can enter a critical range, with a long word line transit time.

It is accordingly an object of the invention to provide a semiconductor memory, which overcomes the hereinaforementioned disadvantages of the heretofore-known devices of this general type and which assures the most compact possible construction and minimum chip surface area, with the shortest possible word line transit time.

With the foregoing and other objects in view there is provided, in accordance with the invention, a semiconductor memory, comprising a rectangular chip surface having corners; four combined cell field blocks each being disposed at a respective one of the corners of the chip surface; rectangular cell field blocks combined in each of the combined cell field blocks, each two of the cell field blocks having edges facing each other; cell fields combined into each of the cell field blocks, the cell fields having word and bit lines; decoder blocks facing each other on the edges of the cell field blocks; the chip surface having a surface area between the decoder blocks being free of cell fields; peripheral circuit blocks disposed inside the surface area being free of cell fields; and connection paths or pads disposed inside the surface area being free of cell fields for connecting the semiconductor memory to connections or terminals of a housing.

In accordance with another feature of the invention, there are provided driver stages disposed between the cell fields for amplifying bit line signals of the cell fields.

In accordance with a further feature of the invention, there are provided driver stages disposed between the cell field blocks for amplifying word line signals of the cell fields.

In accordance with a concomitant feature of the invention, there are provided driver stages disposed between the cell field blocks for amplifying bit line signals of the cell fields.

Other features which are considered as characteristic for the invention are set forth in the appended claims.

Although the invention is illustrated and described herein as embodied in a semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
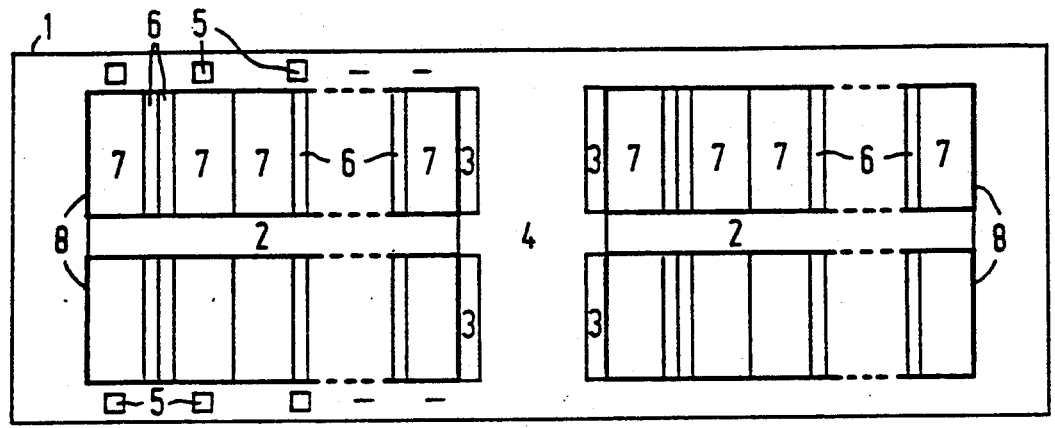
FIG. 1 is a diagrammatic, top-plan view of a 16-megabyte semiconductor chip according to the state of the art.

Referring now to the Figures of the drawing in detail and first, particularly, to FIG. 1 thereof, it is seen that the 16-megabyte semiconductor chip of the state of the art has cell fields 7 disposed in a rectangle in four single or simple cell field blocks 8 on a rectangular chip surface 1. Driver stages 6 are disposed between the cell fields 7, parallel to the shorter sides of the single cell field blocks 8. Decoder blocks including bit decoders 3 and word decoders 2 are disposed on facing or oppositely disposed edges of each of two single cell field blocks 8. The bit decoders 3 are located on the shorter sides of the cell field blocks 8, and the word decoders 2 are located on the longer sides of the single cell field blocks 8. The word decoders 2 located between each two single cell field blocks 8 in this case form one coherent block, while in contrast a free surface area 4 between the bit decoders 3 and the remainder of the free surface area 4 located around the single cell field blocks 8 on the chip periphery, can be used for peripheral circuits 11. Connection paths or pads 5 are disposed on both edges of the longer chip side.

The disadvantage of the configuration of FIG. 1 is that lines for connecting peripheral circuits 11 or the connection paths 5 to other circuit blocks become quite long. Moreover, with an increasing scale of integration, the length of the word lines can enter a critical range, with a long word line transit time.

Figure 2:
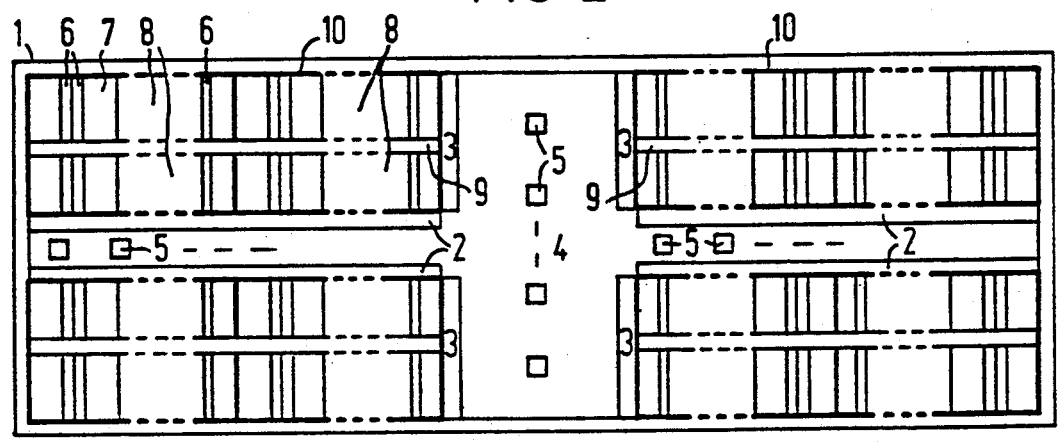
FIG. 2 is a top-plan view of a first exemplary embodiment of a semiconductor memory according to the invention.

The invention will be described below in conjunction with FIGS. 2 and 3. FIG. 2 is a plan view of a semiconductor memory chip with the configuration according to the invention. The chip of FIG. 2 is a 64-megabyte semiconductor memory chip, in which four combined cell field blocks 10 are disposed on the corners of the chip surface 1. Within one combined cell field block 10, four single cell field blocks 8 are disposed rectangularly, with each of the single cell field blocks 8 corresponding to one cell field block 8 of the 16-megabyte semiconductor chip shown in Fig. 1. One driver stage 9 is disposed between each two single cell field blocks 8 inside and parallel to the longer side of a combined cell field block 10. The driver stage 9 amplifies the signals of the word lines of the single cell field blocks 8. The decoder blocks 2, 3 are again disposed on the opposite edges of each two combined cell field blocks 10, but the word decoder blocks 2 do not form a coherent block. In this case, the free surface area 4 that can be used for the peripheral circuit blocks 11, is located only between the decoder blocks 2, 3. The connection paths or pads 5 are disposed inside the free surface area 4, parallel to the word decoders 2 and/or parallel to the bit decoder blocks 3.

Figure 3:
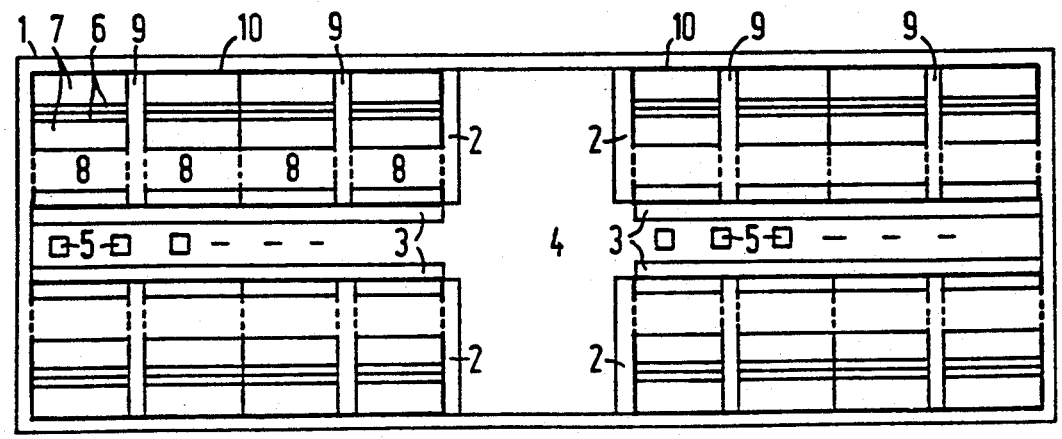
FIG. 3 is a view similar to FIG. 2 of a second exemplary embodiment of a semiconductor memory according to the invention.

FIG. 3 shows a further exemplary embodiment of a configuration according to the invention, in a plan view of a semiconductor chip. The chip of FIG. 3 is substantially constructed like the semiconductor memory chip shown in FIG. 2. Once again, four combined cell field blocks 10 are provided, and once again a combined cell field block 10 includes four single cell field blocks 8 known from FIG. 1. In this case these blocks are disposed side by side, and are rotated by 90° as compared with the single cell field blocks 8 shown in FIGS. 1 and 2. The configuration of the combined cell field blocks 10 and the decoder blocks 2, 3 is equivalent to that shown in FIG. 2, except that in this case the bit decoder blocks 3 are located parallel to the longer side of the combined cell field blocks 10. The word decoder blocks 2 are correspondingly located parallel to the shorter side of the combined cell field blocks 10. One driver stage 9 for the word line signals is located between each of the first two single cell field blocks 8 and the last two single cell field blocks 8 of each combined cell field block 10. The free space 4 and the configuration of the connection paths are equivalent to that which has been shown in FIG. 2.

The configuration shown in FIGS. 2 and 3 assures shorter connections between the connection paths or pads 5 and the various circuit blocks. The influence of the word line length on the switching times is reduced by driver stages 9. This configuration is not restricted to being used in 64-megabyte DRAM memories.

We claim:

1. A semiconductor memory comprising a rectangular chip surface with circuit elements on the chip surface, having:
   a plurality of decoder blocks of first and second type, peripheral circuit blocks, cell fields having word and bit lines, on the chip surface, and a free surface area having no circuit elements;
   a plurality of cell field blocks composed of said cell fields;
   a plurality of connecting pads for connecting the circuit elements with connecting wires of a semiconductor memory housing;
   a plurality of combined cell field blocks composed of respective ones of said cell field blocks;
   wherein said decoder blocks of first and second type are associated with respective ones of said combined cell field blocks;
   said plurality of decoder blocks being disposed with all of the same type on respective oppositely facing edges of said combined cell field blocks;
   said free surface being disposed between said oppositely facing decoder blocks; and
   said connecting pads being disposed only between said oppositely facing decoder blocks.

2. A semiconductor memory according to claim 1, including first driver stages connected between said cell fields for amplifying signals on said bit lines of the cell fields.

3. A semiconductor memory according to claim 2, including second driver stages connected between said rectangular cell field blocks for amplifying signals on said word lines.

4. Semiconductor memory according to claim 1, wherein said first driver stages are disposed between said rectangular cell field blocks for amplifying signals on said bit lines.

5. Semiconductor memory according to claim 1, wherein said peripheral circuit blocks are disposed on said free surface area.

6. Semiconductor memory according to claim 1, wherein said combined cell field blocks are disposed along edges of said chip surface.

* * * * *

UNITED STATES PATENT AND TRADEMARK OFFICE
CERTIFICATE OF CORRECTION

PATENT NO. : 5,109,265
DATED : April 28, 1992
INVENTOR(S) : Matthias Utesch, Martin Peisl It is certified that error appears in the above-indentified patent and that said Letters Patent is hereby corrected as shown below:

```
Column 1, line 22, change "megabyte" to -- megabit --;
          line 60, change "megabyte" to -- megabit --.
Column 2, line 61, change "megabyte" to ---megabit --.
Column 3, line  3, change "megabyte" to -- megabit --;
          line 31, change "megabyte" to -- megabit --;
          line 37, change "megabyte" to -- megabit --.
Column 4, line 18, change "megabyte" to -- megabit --.
```

Signed and Sealed this

Tenth Day of May, 1994

Attest:

BRUCE LEHMAN

*Attesting Officer*   *Commissioner of Patents and Trademarks*